(12) United States Patent
Crotti et al.

(10) Patent No.: US 11,793,085 B2
(45) Date of Patent: Oct. 17, 2023

(54) METHOD OF FORMING A MAGNETIC TUNNELING JUNCTION DEVICE

(71) Applicant: IMEC vzw, Leuven (BE)

(72) Inventors: Davide Francesco Crotti, Leuven (BE); Kevin Garello, Leuven (BE)

(73) Assignee: IMEC vZw, Leuven (BE)

( * ) Notice: Subject to any disclaimer, the term of this patent is extended or adjusted under 35 U.S.C. 154(b) by 265 days.

(21) Appl. No.: 17/445,557

(22) Filed: Aug. 20, 2021

(65) Prior Publication Data
US 2022/0059760 A1    Feb. 24, 2022

(30) Foreign Application Priority Data
Aug. 21, 2020    (EP) .................................... 20192218

(51) Int. Cl.
H01L 51/50    (2006.01)
H10N 50/01    (2023.01)
(Continued)

(52) U.S. Cl.
CPC ............. H10N 50/01 (2023.02); H10B 61/00 (2023.02); H10N 50/80 (2023.02)

(58) Field of Classification Search
CPC ................................ H10N 50/01; H10B 61/00
See application file for complete search history.

(56) References Cited

U.S. PATENT DOCUMENTS

| | | |
|---|---|---|
| 2017/0222135 A1 | 8/2017 | Fukami et al. |
| 2018/0277185 A1 | 9/2018 | Shimizu et al. |

(Continued)

FOREIGN PATENT DOCUMENTS

JP    2020-92144 A    6/2020

OTHER PUBLICATIONS

Extended European Search Report dated Feb. 4, 2021 in counterpart European Application No. 20192218.4 in 14 pages.
(Continued)

*Primary Examiner* — Anthony Ho
(74) *Attorney, Agent, or Firm* — Knobbe, Martens, Olson & Bear, LLP (57) ABSTRACT

According to an aspect, there is provided a method of forming a magnetic tunneling junction (MTJ) device, including: forming a layer stack including an MTJ layer structure and a spin-orbit torque (SOT) layer below the MTJ layer structure; forming a first etch mask over the layer stack, the first etch mask including a first mask line extending in a first horizontal direction; patterning the layer stack to form an MTJ line extending in the first horizontal direction, the patterning including etching while the first etch mask masks the layer stack, and stopping etching on or above the SOT-layer; forming sidewall spacers on one or both sides of the MTJ line; while the sidewall spacers mask the SOT-layer, etching the SOT-layer to form a patterned layer stack including the MTJ line and a first patterned SOT-layer; forming a second etch mask over the patterned layer stack, the second etch mask including a second mask line extending in a second horizontal direction across the MTJ line; and patterning the patterned layer stack to form a twice patterned SOT-layer, the twice patterned SOT-layer including an SOT-line extending in the second horizontal direction, and to form an MTJ pillar on the SOT-line, the patterning including etching while the second etch mask masks the patterned layer stack.

19 Claims, 5 Drawing Sheets

(51) Int. Cl.
   *H10B 61/00*   (2023.01)
   *H10N 50/80*   (2023.01)

(56) References Cited

U.S. PATENT DOCUMENTS

| | | |
|---|---|---|
| 2018/0277746 A1 | 9/2018 | Abe et al. |
| 2018/0366638 A1 | 12/2018 | Lin et al. |
| 2020/0006636 A1 | 1/2020 | Gosavi et al. |
| 2020/0135805 A1 | 4/2020 | Hsu |
| 2020/0136022 A1 | 4/2020 | Lin et al. |

OTHER PUBLICATIONS

Garello et al., "SOT-MRAM 300mm integration for low power and ultrafast embedded memories", 2018 Symposium on VLSI Circuits Digest of Technical Papers, ©2018 IEEE, pp. 81-82.

Ohsawa et al., "Ultra-high-efficiency Writing in Voltage-Control Spintronics Memory (VoCSM); the Most Promising Embedded Memory for Deep Learning", 2168-6734 (c) 2018 IEEE Journal of the Electron Devices Society, 7 pages.

Shirotori et al., "Voltage-Control Spintronics Memory With a Self-Aligned Heavy-Metal Electrode", IEEE Transactions on Magnetics, vol. 53, No. 11, Nov. 2017, 4 pages.

METHOD OF FORMING A MAGNETIC TUNNELING JUNCTION DEVICE

CROSS-REFERENCE TO RELATED APPLICATIONS

This application claims foreign priority to European Patent Application No. EP 20192218.4, filed Aug. 21, 2020, the content of which is incorporated by reference herein in its entirety.

BACKGROUND

Technical Field

The disclosed technology generally relates to a method of forming a magnetic tunneling junction (MTJ) device.

Description of the Related Technology

Magnetoresistive random-access memory (MRAM) technology is a promising candidate for future memory technology. The data storing function of an MRAM device may be provided by magnetic tunneling junction (MTJ) devices. An MTJ device can allow data to be stored and read by controlling and sensing, respectively, the relative orientations of the magnetizations of free and reference layers of a layer structure of the MTJ device.

SUMMARY OF CERTAIN INVENTIVE ASPECTS

An MTJ layer device may comprise an MTJ pillar having a layer structure including a free layer, a tunnel barrier layer, a reference layer and a pinning layer. A magnetization state of the reference layer can be fixed or pinned by the pinning layer. A magnetization state of the free layer may be switched between two different directions, parallel and anti-parallel to the magnetization direction of the reference layer.

A writing operation of the MTJ device generally can involve changing/switching the magnetization direction of the free layer between the parallel and the anti-parallel states. The free layer magnetization direction may be controlled by a spin-torque transfer (STT) effect, where the magnetization direction is changed by passing a relatively high current through the MTJ layer structure, parallel to the stacking direction of the layers. The free layer magnetization direction may alternatively be controlled by a spin-orbit torque (SOT) effect wherein the magnetization direction is changed by passing a current through an additional SOT-generating layer arranged below the MTJ layer structure. The STT-effect and the SOT-effect may also be used in conjunction to enable faster switching of the magnetization direction of the free layer.

A challenge in the fabrication of such MTJ devices is that when scaling down the size of the MTJ devices, it may prove difficult to align the SOT-layer with the MTJ pillar. The SOT-layer and MTJ pillar can be formed independently, e.g., by first patterning the MTJ pillar and then patterning the SOT-layer. For the patterned MTJ pillar to be in contact with the patterned SOT-layer, the SOT-layer may be made larger than the cross-section of the MTJ pillar. This may cause current circumvention, where a current running through the SOT-layer may circumvent the MTJ pillar, thereby lowering the SOT-effect that the SOT-layer is intended to have.

An objective of the disclosed technology is to address this and other challenges.

According to an aspect of the disclosed technology, there is provided a method of forming a magnetic tunneling junction (MTJ) device. The method can comprise forming a layer stack comprising an MTJ layer structure and a spin-orbit torque (SOT) layer below the MTJ layer structure. The method can also include forming a first etch mask over the layer stack. The first etch mask can comprise a first mask line extending in a first horizontal direction. The method can include patterning the layer stack to form an MTJ line extending in the first horizontal direction. The patterning can comprise etching while the first etch mask masks the layer stack, and stopping the etching on or above the SOT-layer. The method can include forming sidewall spacers on one or both sides (e.g., on either side in some instances) of the MTJ line. While the sidewall spacers mask the SOT-layer, the method can include etching the SOT-layer to form a patterned layer stack comprising the MTJ line and a first patterned SOT-layer. The method can include forming a second etch mask over the patterned layer stack. The second etch mask can comprise a second mask line extending in a second horizontal direction across the MTJ line. The method can include patterning the patterned layer stack comprising the first patterned SOT-layer and the MTJ line to form a twice patterned SOT-layer and to form an MTJ pillar on the SOT-line. The twice patterned SOT-layer can comprise an SOT-line extending in the second horizontal direction. The patterning can comprise etching while the second etch mask masks the patterned layer stack (e.g., comprising the first patterned SOT-layer and the MTJ line).

In various implementations, the method can allow forming of an MTJ pillar and an SOT-line which are self-aligned with respect to each other. In some instances, the MTJ pillar can be formed where the second etch mask overlaps the first etch mask, e.g., where the first mask line and the second mask line intersect.

A first cross-sectional dimension (e.g., as seen along the first horizontal direction) of the MTJ pillar may be controlled by a width of the second mask line. A second cross-sectional dimension (e.g., as seen along the second horizontal direction) of the MTJ pillar may be controlled by a width of the first mask line.

A width of the MTJ line may be controlled by a width of the first mask line.

A width of the SOT-line (e.g., along the first horizontal direction) may be controlled by a width of the second mask line. A length of the SOT-line (e.g., along the second horizontal direction) may be controlled by a combined width of the first mask line and the sidewall spacers.

Because the width of the SOT-line and the first cross-sectional dimension of the MTJ pillar can be controlled by the same mask line (e.g., the second mask line) in some implementations, they can, e.g., barring etch effects such as shading and under etching, have a similar extension, thereby lowering current circumvention. In some instances, the interface between the SOT-layer and the MTJ pillar may be coextensive with a width of the MTJ line.

In various implementations, the first horizontal direction and second horizontal direction can be independent, which can allow for freedom in the selection of the angle between them. As such, different shapes of the MTJ pillar may be achieved by changing the shape of the intersection of the first mask line and the second mask line.

As used herein, the term "horizontal" (for instance with reference to a direction or a plane) can denote a geometrical axis being perpendicular to a stacking direction of the layers of the device. Accordingly, a "horizontal" direction can be parallel to a main plane of extension or a main surface of any of the layers of the device, such as the SOT-layer. In other words, a "horizontal" direction can be an in-plane direction with respect to the layers of the MTJ layer structure.

Correspondingly, the term "vertical" can denote a geometrical axis being parallel to a stacking direction of the layers of the device, e.g., perpendicular to the horizontal axis. Terms such as "above" and "under" as used herein may accordingly refer to opposite directions along the vertical axis, with respect to a reference.

One layer may be arranged "on" another layer by being arranged directly on, e.g., above and in contact with, the other layer. One layer may also be arranged "on" another layer by being arranged on the other layer with one or more intermediate layers present in between.

As used herein, when reference is made to a layer, that layer may be a single material layer, or have a composite or multilayer structure (for instance a free layer, a reference layer or a pinning layer having at least two sublayers of different properties, type, or material). The prefix "sub" in "sublayer" may be omitted for brevity.

The MTJ layer structure may include a free layer, a tunnel barrier layer, a reference layer and a pinning layer.

The free layer can be a layer having a (e.g., net) magnetization which may be varied. For example, the direction of the magnetization vectors or magnetic moments of the free layer may be varied. The direction of the magnetization of the free layer may be varied between two states, a "parallel" state where the magnetization direction of the free layer is parallel to the magnetization direction of the reference layer and an "anti-parallel" state where the magnetization direction of the free layer is anti-parallel to the magnetization direction of the reference layer. The free layer may also be referred to as a storage layer.

The reference layer can be a layer having a (e.g., net) magnetization which may be fixed or pinned. For example, the direction of the magnetization vectors or magnetic moments of the reference layer can be fixed or pinned such that it does not change, e.g., when writing to the free layer. The reference layer may also be referred to as the fixed layer or the pinned layer.

The free layer may be a ferromagnetic layer. The reference layer may be a ferromagnetic layer. The free layer may be a soft-magnetic layer. The reference layer may be a hard-magnetic layer. The denominations "soft" and "hard" may herein be understood as the free layer being arranged or formed to present a (e.g., magnetic) coercivity which can be less than a coercivity of the reference layer.

The pinning layer can be adapted to fix or pin the magnetization direction of the reference layer. The pinning layer may be a hard-ferromagnetic layer or configured as an anti-ferromagnetic layer.

The tunnel barrier layer can be arranged between the reference layer and the free layer. The tunnel barrier layer can be a non-ferromagnetic and electrically insulating layer. The tunnel barrier layer can be adapted to allow a tunneling current across the tunnel barrier layer.

The MTJ layer structure may be formed on the SOT-layer. In some instances, the etching during the patterning of the layer stack to form the MTJ line may be stopped on the SOT-layer (e.g., the etching may be stopped when the SOT-layer is exposed). The layer stack may also comprise an interfacial layer on the SOT-layer where the MTJ layer structure is formed on the interfacial layer. In some instances, the etching during the patterning of the layer stack to form the MTJ line may be stopped above the SOT-layer, on the interfacial layer (e.g., the etching may be stopped when the interfacial layer is exposed). In various instances, the etching during the patterning of the layer stack to form the MTJ line may be stopped before etching through the SOT-layer.

The SOT-layer may be a non-magnetic metal layer of for instance tantalum (Ta), tungsten (W), or platinum (Pt), or topological insulators such as such as bismuth selenide ($Bi_2Se_3$). By passing an in-plane current $I_{SOT}$ through the SOT-layer, a perpendicular spin current may be generated and transferred to the magnetization of the free layer of the MTJ layer structure, usually formed at the bottom of the MTJ layer structure, e.g., on top of the SOT-layer, creating a spin-orbit torque in the free layer and inducing magnetization reversal. The origin of the spin current may be described by the spin Hall-effect (e.g., in the bulk of the SOT-layer) and from Rashba interaction (e.g., at the interface between the SOT-layer and the free layer).

The layer stack may be formed on an insulating layer embedding a first and second terminal spaced apart in the second horizontal direction where the SOT-layer is formed in contact with the first and second terminals, and where the sidewall spacers are formed to at least partially overlap the first and second terminals such that the SOT-line of the twice patterned SOT-layer can connect the first and second terminals to each other.

The first and second terminals can allow for a current to run through the SOT-layer. This can allow for writing operations for the MTJ device. By spacing the first and second terminals apart in the second horizontal direction, the MTJ pillar may be formed in the middle of the two terminals, e.g., so that an in-plane current $I_{SOT}$ running between the two terminals through the SOT-layer goes past the MTJ pillar.

The layer stack may further comprise a hard mask layer, where after patterning the patterned layer stack, the MTJ pillar can be capped by a remaining portion of the hard mask layer.

The portion of the MTJ layer structure which will form an MTJ pillar may be protected during the various etching steps. Further, the hard mask layer may be a top electrode (e.g., metal) layer, where the capping may remain on the finished MTJ pillar and be used as a top electrode thereon.

The second etch mask may mask the sidewall spacers, where after patterning the patterned layer stack, sidewall spacer portions may remain at sidewalls of the MTJ pillar.

Leaving sidewall spacer portions at sidewalls of the MTJ pillar may mask the MTJ pillar during future processing steps and/or electrically isolate the MTJ pillar.

A fill layer may be deposited to embed the layer stack before forming the second etch mask. For example, the fill layer may embed the MTJ line during the forming of the second etch mask.

The fill layer may form a planarizing layer. A topography variation caused by etching may be compensated for in some instances. For example, the fill layer may be formed with a planar upper surface on which the second etch mask may be formed.

The method may comprise forming an insulating liner covering sidewalls of the MTJ pillar exposed on either side of the SOT-line.

Forming insulating liners on sidewalls of the MTJ pillar may mask the MTJ pillar during future processing steps and/or electrically isolate the MTJ pillar.

In some implementations, the disclosed technology can allow for the angle between the first horizontal direction (e.g., defining an orientation of the first mask line) and the second horizontal direction (e.g., defining an orientation of the second mask line) to be varied. An angle of 90 degrees may allow a rectangular cross-sectional shape of the MTJ pillar (and accordingly also of an MTJ pillar-SOT-layer interface in various implementations). According to an alternative, the angle may however differ from 90 degrees. The second horizontal direction may e.g., be 30-80 degrees from the first horizontal direction.

Different angles can allow for different shapes of the MTJ pillar and the SOT-line, while still allowing them to be aligned. The different shapes may introduce directional anisotropy in the MTJ pillar (e.g., in the free layer of the layer structure of the MTJ pillar) that may be used to tune SOT-switching characteristics of the MTJ device. The different shapes may allow for different electromagnetic properties, or geometrically allow for the MTJ pillars to be closer together.

The disclosed technology can allow forming of a plurality of MTJ devices in parallel. According to such an approach, there is provided a method of forming a plurality of MTJ devices, e.g., an array of MTJ devices. The method can comprise forming a layer stack comprising an MTJ layer structure and a spin-orbit torque layer below the MTJ layer structure. The method can include forming a first etch mask over the layer stack. The first etch mask can comprise a plurality of first mask lines extending in a first horizontal direction. The method can include patterning the layer stack to form a plurality of MTJ lines extending in the first horizontal direction. The patterning can comprise etching while the first etch mask masks the layer stack, and stopping etching on the SOT-layer. The method can include forming sidewall spacers on one or both sides (e.g., on either side in some instances) of each MTJ line.

As used herein, reference to "each" of a particular element (e.g., "each MTJ line") may refer to two or more of the elements, and may or may not refer to every one of the elements in the device. For example, "each MTJ line" may refer to individual ones of a plurality of MTJ lines and not necessarily every single MTJ line in the device.

While the sidewall spacers mask the SOT-layer, the method can include etching the SOT-layer to form a patterned layer stack comprising the MTJ lines and a first patterned SOT-layer. The method can include forming a second etch mask over the patterned layer stack. The second etch mask can comprise a plurality of second mask lines extending in a second horizontal direction across the MTJ lines. The method can include patterning the patterned layer stacks (e.g., comprising the first patterned SOT-layer and the MTJ lines) to form a twice patterned SOT-layer. The twice patterned SOT-layer can comprise a plurality of SOT-lines extending in the second horizontal direction, and an MTJ pillar on each SOT-line. Patterning can comprise etching while the second etch mask masks the patterned layer stack (e.g., comprising the first patterned SOT-layer and the MTJ lines).

The plurality of SOT-lines extending in the second horizontal direction may comprise several discrete SOT-line segments distributed along the second horizontal direction.

By forming the first and/or second etch mask with a plurality of etch lines, an array of self-aligned MTJ pillars may be formed. The MTJ pillars can be self-aligned with the SOT-lines in the same manner as discussed in connection with various implementations of the method described herein, e.g., the width of each SOT-line and the first cross-sectional dimension of each corresponding MTJ pillar can be controlled by the same mask line. The array of MTJ pillars may e.g., be used for a magnetoresistive random-access memory (MRAM).

The layer stack may be formed on an insulating layer embedding a plurality of terminal pairs of a first and a second terminal. The first and second terminals of each pair can be spaced apart in the second horizontal direction and the SOT-layer can be formed in contact with the plurality of first and second terminals pairs. The sidewall spacers on each respective MTJ line can be formed to at least partially overlap the plurality of first and second terminals of a respective terminal pair such that each of the plurality of SOT-lines of the twice patterned SOT-layer can connect a respective terminal pair of first and second terminals of the plurality of first and second terminals to each other.

The layer stack may comprise a hard mask layer. After patterning the patterned layer stack, each MTJ pillar can be capped by a respective remaining portion of the hard mask layer.

The second etch mask may mask the sidewall spacers. After patterning the patterned layer stack, sidewall spacer portions may remain at sidewalls of each MTJ pillar.

The method may comprise forming an insulating liner covering the sidewalls of each MTJ pillar, e.g., after the plurality of MTJ pillars have been formed.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings, like reference numerals will be used for like elements unless stated otherwise.

DETAILED DESCRIPTION OF CERTAIN ILLUSTRATIVE EMBODIMENTS

Figure 4:
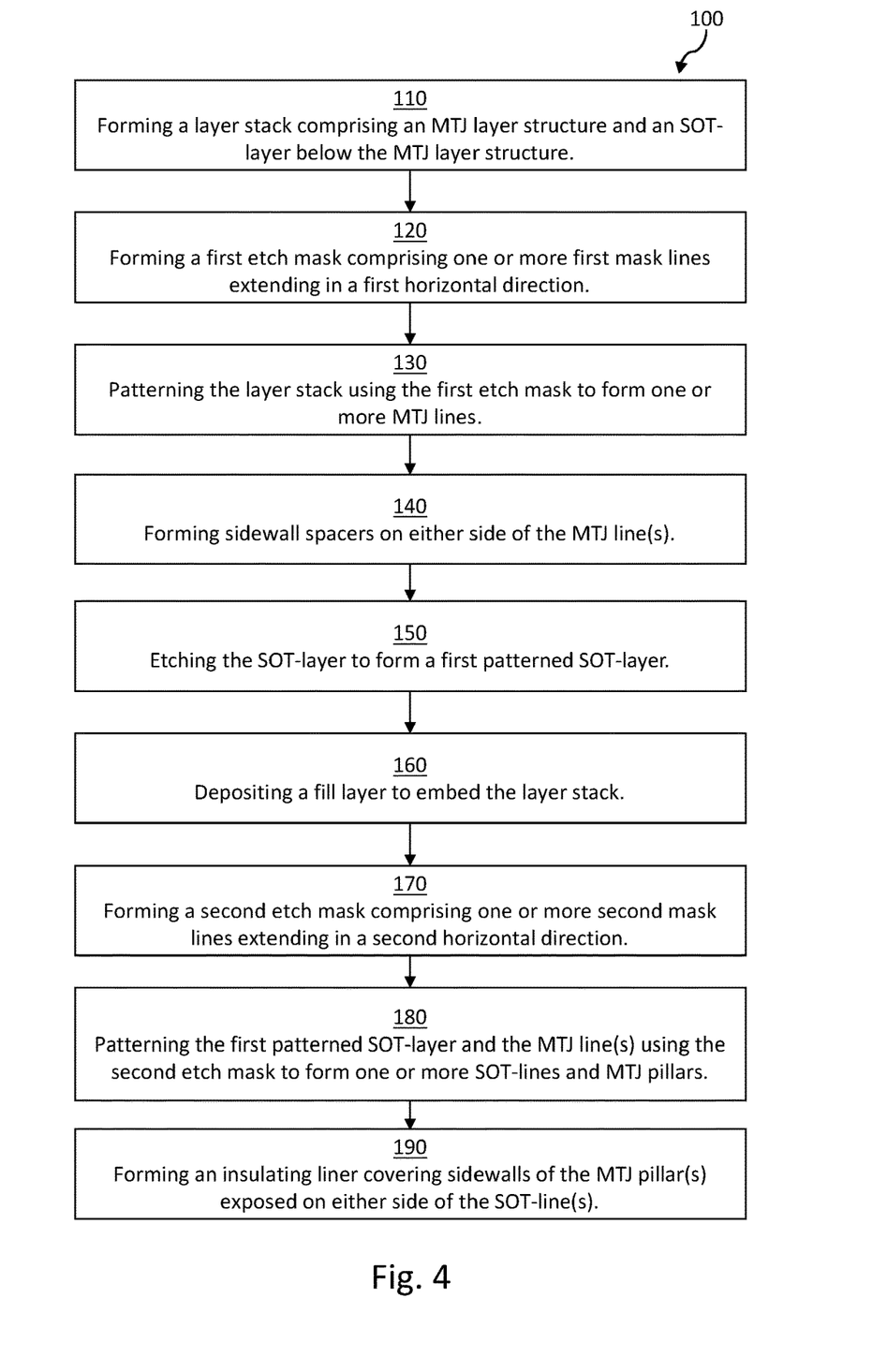
FIG. 4 is a flowchart illustrating an example method of forming an MTJ device.

Referring now to FIGS. 1a-1f, FIG. 2a and the flow chart of FIG. 4, an example method 100 of forming a magnetic tunneling junction (MTJ) device in accordance with various implementations will be disclosed. FIGS. 1a-f show the result of different steps of forming the MTJ device in two different vertical cross-sections. The cross-section to the left in the figure is taken in the second horizontal direction 2000 and the cross-section to the right in the figure is taken in the first horizontal direction 1000. In this embodiment, the first and second horizontal directions 1000, 2000 are orthogonal to each other. A vertical direction 3000 is shown with an arrow pointing upwards in the layer structure, which is orthogonal to both the first and second horizontal directions 1000, 2000.

Figure 1A:
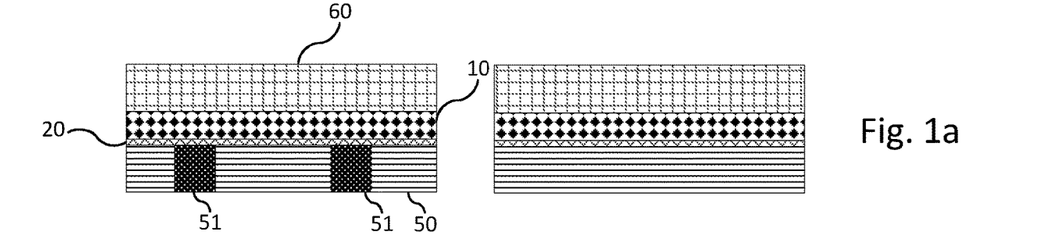
FIGS. 1a, 1b, 1c, 1d, 1e, and 1f are schematic views illustrating various intermediate structures at various stages of an example method of forming an MTJ device.

The method 100 starts in FIG. 1a by forming a layer stack comprising an MTJ layer structure 10 and a spin-orbit torque layer 20 (SOT-layer) below the MTJ layer structure 10 (step 110 of FIG. 4). The layer stack may as shown in FIG. 1a further comprise a hard mask layer 60 on top of the MTJ layer structure 10. The hard mask layer 60 may be formed of a metal-comprising hard mask material, e.g., titanium nitride (TiN), tantalum nitride (TaN), tantalum (Ta), titanium (Ti) or ruthenium (Ru). A metal-comprising hard mask material may remain as a capping on the finished MTJ pillar to form a top electrode of the MTJ pillar. By way of example, a total thickness (e.g., height) of the MTJ layer structure 10 may be 30 nm (e.g., about 30 nm). A thickness of the hard mask layer 60 may be in the range from 30-50 nm in some instances.

Forming the layer stack may comprise depositing different layers of materials, e.g., using sputtering or evaporation processes, or atomic layer deposition (ALD), one at a time in the vertical direction 3000, e.g., bottom-up. For example, in some instances, once a layer of a desired thickness is formed, the material being deposited is changed and the next layer is formed on top of the previous layer.

The MTJ layer structure 10 may comprise a top-pinned MTJ, where a pinned layer is arranged above the free layer and the tunnel barrier layer in some implementations. The MTJ layer structure may comprise a pinning layer arranged above the reference layer. The reference layer and the pinning layer may each comprise one or more ferromagnetic layers. Synthetic antiferromagnetic (SAF) as well as synthetic ferromagnetic (SFM) pinning layer configurations are possible. The method is compatible with MTJs having in-plane magnetic anisotropy as well as MTJs having perpendicular magnetic anisotropy (PMA). Non-limiting examples of suitable materials for MTJ devices include iron (Fe), cobalt (Co), iron boride (FeB), cobalt boride (CoB), cobalt iron (CoFe) and cobalt iron boron (CoFeB) for the free and pinned layer, and magnesium oxide ($MgO_x$), aluminum oxide ($AlO_x$) and magnesium aluminum oxide ($MgAlO_x$) for the tunnel barrier layer.

The layer stack may be formed on an insulating layer 50. The insulating layer 50 can embed a first and second terminal 51 spaced apart in the second horizontal direction 2000. The SOT-layer 20 can be formed in contact with the first and second terminals 51. The first and second terminals 51 may e.g., be electrical contacts adapted to lead an in-plane current $I_{SOT}$ between them in the second horizontal direction 2000 through the SOT-layer 20. The insulating layer 50 may for example be an oxide layer (e.g., silicon oxide) of a back-end-of-line interconnection structure. The interconnection structure may be formed (e.g., using any technique known in the art or yet to be developed) over a substrate supporting an active device region comprising active semiconductor devices (e.g., a front-end-of-line portion). The interconnection structure may comprise a number of interconnection levels, e.g., each comprising horizontal conductive lines and vertical conductive vias embedded in insulating material. The first and second terminals 51 may be connected to lines and/or vias embedded in the insulating layer 50, e.g., underneath the terminals 51.

In the embodiment shown, the MTJ layer structure 10 is formed directly on the SOT-layer 20, which is formed directly on the insulating layer 50. In other embodiments, there may be one or more interfacial layers, such as a high-k dielectric layer.

Figure 1B:
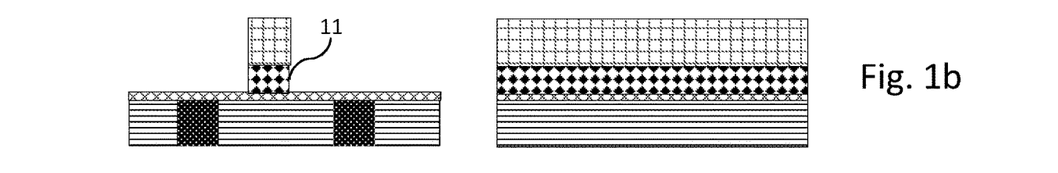

As shown in FIG. 1b, a first etch mask 31 (e.g., visible in the top-view of FIG. 2a) comprising a first mask line extending in a first horizontal direction 1000 can be formed (step 120 of FIG. 4). The etch mask 31 may in a patterning step counteract etching of parts of the layer stack, e.g., the parts below the first mask line in this case. The first etch mask 31 may be formed of, or comprise, one or more hard mask material layers, suitable for acting as an etch mask during patterning of the layer stack, e.g., including the hard mask layer 60. For example, the first etch mask 31 may be a multi-layered mask, comprising a sequence of metal-comprising and/or insulating layers.

The first etch mask 31 may be a lithographically defined etch mask. A line feature may be lithographically defined in a photoresist layer. It is also possible to form the first etch mask using multi-patterning techniques such as self-aligned double patterning (SADP) or self-aligned quadruple patterning (SAQP). Such multi-patterning techniques may also facilitate patterning a plurality of MTJ lines, e.g., as will be discussed in connection with FIG. 3.

Still referring to FIG. 1b, while the first etch mask 31 masks the layer stack, the layer stack can be etched (step 130 of FIG. 4), stopping on the SOT-layer 20, to form an MTJ line 11 extending in the first horizontal direction 1000. If an interfacial layer is present between the SOT-layer 20 and the MTJ layer structure 10, the etching may be stopped on the interfacial layer, hence above the SOT-layer 20. The etching may first extend through the hard mask layer 60 and thereafter extend through the MTJ layer structure 10. The first etch mask 31 may remain on the layer stack during the full etching to the SOT-layer 20. However, it is also possible to remove the first etch mask 31 after etching the hard mask layer 60, wherein the hard mask layer 60 may act as the (e.g., sole etch match in some instances) etch mask during etching of the MTJ layer structure. The etch may be an anisotropic etch, e.g., etching the layer stack in a top-down direction. The etch may be a dry etch, such as an inter-layer dielectric (ILD) lithographic etch. The etch may be reactive ion etching (RIE) and/or ion beam etching (IBE).

In various implementations, the width of the first mask line may determine a second cross-sectional dimension (e.g., as seen along the second horizontal direction 2000) of the MTJ line 11, which in the disclosed technology can correspond to a width of the MTJ line 11.

The MTJ line 11 can be formed at a position between the first and second terminals 51, e.g., as seen along the second horizontal direction 2000. In various instances, the first mask line may be formed to mask the layer stack in an area between the terminals 51.

Figure 1C:
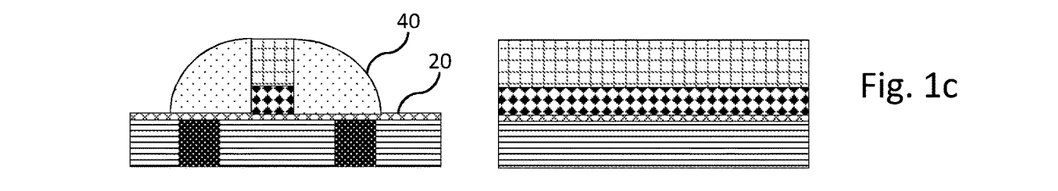

As shown in FIG. 1c, sidewall spacers 40 can be formed on one or both sides (e.g., on either side in some instances) of the MTJ line 11 (step 140 of FIG. 4). The sidewall spacers 40 may as shown also be formed along the sidewalls of the patterned hard mask 60. The sidewall spacers 40 may in a patterning step counteract etching of parts of the SOT-layer 20 from being etched, e.g., the parts below the sidewall spacers 40. The sidewall spacers 40 may or may not cover the MTJ line 11.

The sidewall spacers 40 may be formed using a sidewall spacer deposition process. A spacer material may be conformally deposited to cover the MTJ line 11 and the SOT-layer 20. The spacer material may be subjected to an anisotropic etch, e.g., etching back (top-down) the spacer material such that the spacer material can be removed from horizontally oriented surfaces but remain on the (e.g., vertically oriented) sidewalls of the MTJ line 11 to form the sidewall spacers 40. The sidewall spacers 40 may e.g., be formed by an oxide-, nitride- or carbide-based material. Some example materials can include silicon oxide ($SiO_2$), silicon nitride (SiN), aluminum oxide ($AlO_x$), silicon carbide (SiC), silicon oxycarbide (SiCO) or a combination of these materials.

Figure 1D:
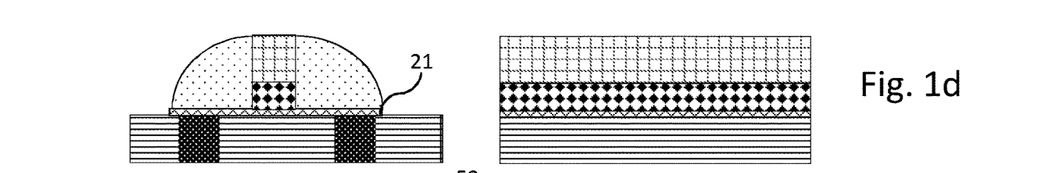

Referring now to FIG. 1d, while the sidewall spacers 40 mask the SOT-layer 20, the SOT-layer is etched to form a first patterned SOT-layer 21 (step 150 of FIG. 4), which also may be referred to as the "once" patterned SOT-layer 21. A patterned layer stack comprising the MTJ line 11 and the first patterned SOT-layer 21 can be formed. The first etch mask 31 may be removed prior to forming the sidewall spacers 40 in some implementations. Thus, the patterned hard mask 60 may mask the MTJ line 11 during the etching of the SOT-layer 20.

The combined width of the sidewall spacers 40 and the first mask line may in various instances determine the length of the SOT-layer 20 in the second horizontal direction 2000.

The first patterned SOT-layer 21 may as shown in FIG. 1d be formed to cover both the first and second terminals 51 such that an in-plane current $I_{SOT}$ between them can run through the SOT-layer 20 without loss e.g., due to a smaller contact surface or resistance mismatch interference at the interface between the SOT-layer 20 and the terminals 51. In various implementations, the sidewall spacers 40 may be formed to at least partially overlap the first and second terminals 51 such that the first patterned SOT-layer 21 can connect the first and second terminals 51 to each other.

Figure 1E:
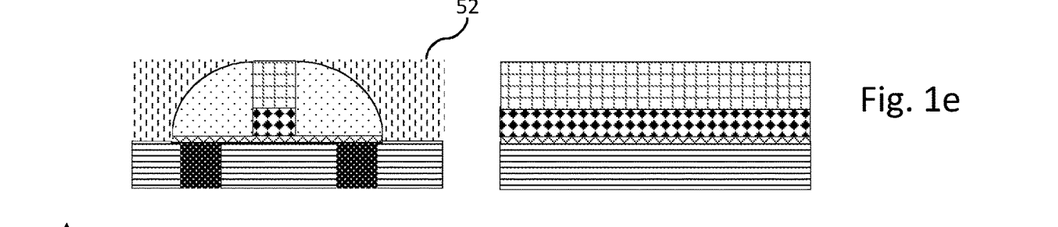

As shown in FIG. 1e, a fill layer 52 may be deposited to embed the (e.g., patterned) layer stack before forming a second etch mask (step 160 of FIG. 4) in various instances. The fill layer 52 may be formed with a planar upper surface to facilitate forming of a second etch mask 32, as will be discussed below with respect to FIG. 2a. In order to planarize the fill layer 52, chemical-mechanical planarization (CMP) may be used. The fill layer 52 may comprise an electrical insulator such as an oxide, e.g. $SiO_2$, or another conventional inter-layer dielectric. According to another example, the fill layer 52 may be a sacrificial layer, e.g., a spin-on-carbon layer, to be replaced later by an oxide or inter-layer dielectric after completing the process steps.

The fill layer 52 may embed the sidewall spacers 40, as shown in FIG. 1e. The second etch mask 32 may be formed to mask parts of the sidewall spacers 40. Alternatively, it is contemplated that the sidewall spacers 40 may be removed before the fill layer 52 is deposited 160, e.g., when their presence in the resulting device structure may not be desired. However, preserving the sidewall spacers 40 may serve to protect the SOT-layer 20 in some instances.

The second etch mask 32 (visible in FIG. 2a) can be formed (step 170 of FIG. 4) over the patterned layer stack. The second etch mask 32 can comprise a second mask line extending across the first patterned SOT-layer 21 and the MTJ line 11 in a second horizontal direction 2000. The second etch mask 32 may counteract etching of parts of the layer stack, e.g., the parts below the second mask line in this case. For example, the second etch mask 32 may be a multi-layered mask, e.g., comprising a sequence of metal-comprising and/or insulating layers. In some implementations, the second etch mask 32 may be formed in a similar manner as the first etch mask 31, as discussed in relation to FIG. 1b. The second etch mask 32 may in some instances differ from the composition of the first etch mask 31 in that it may be desirable to etch parts of both hard mask 60 and the sidewall spacers 40 that are not covered by the second etch mask 32. In some such cases, the second etch mask 32 may comprise material(s) that counteracts a type of etching that is able to etch the hard mask 60 and the sidewall spacers 40.

Figure 1F:
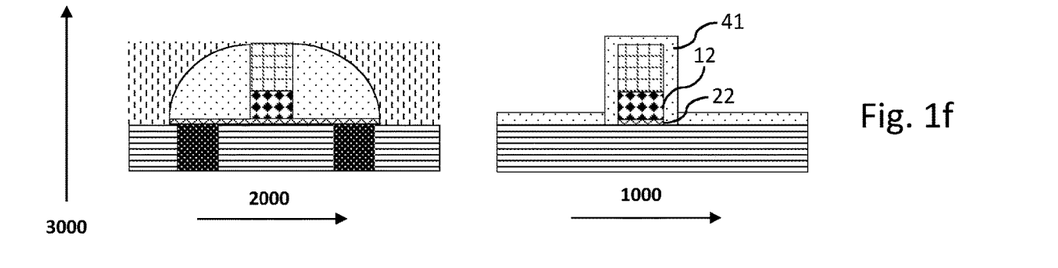
Figure 2A:
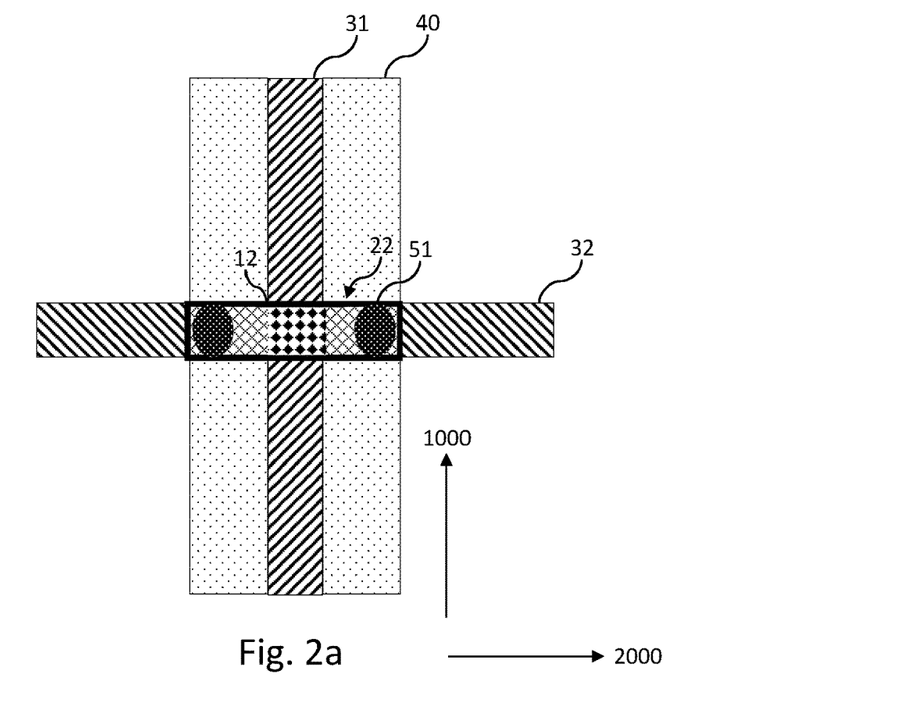
FIG. 2a is a schematic view of an example MTJ device formed using first and second mask lines oriented at right angles with respect to each other.

Referring to FIG. 1f, the patterned layer stack can be patterned using the second etch mask 32 (step 180 of FIG. 4). The patterning may comprise, while the second etch mask 32 masks patterned layer stack (e.g., comprising the first patterned SOT-layer 21 and the MTJ line 11), etching the first patterned SOT-layer 21, and the MTJ line 11, as well as the hard mask 60 and the sidewall spacers 40. A twice patterned SOT-layer 22 (as shown in FIG. 2a) may be formed. The twice patterned SOT-layer 22 can comprise an SOT-line extending in the second horizontal direction 2000. Additionally, an MTJ pillar 12 may be formed on the SOT-line. The (twice) patterned hard mask 60 may form a cap on the resulting MTJ pillar 12. Additionally, sidewall spacer portions may remain at sidewalls of the MTJ pillar 12. The etching may extend through the fill layer 52 (e.g., in regions not covered by the second etch mask 32). The etch may be anisotropic and in the vertical direction. The etch may be a dry etch, such as a RIE, an IBE, or an ILD lithographic etch.

The second etch mask 32 may remain on the patterned layer stack during the full etching through the first patterned SOT-layer 21. However, it is also possible to remove the second etch mask 32 after reaching the first patterned SOT-layer 21. The patterned sidewall spacers 40, and the (twice) patterned hard mask layer 60 may then act as a combined etch mask during etching of the first patterned SOT-layer 21.

The width of the second mask line can determine the width of the SOT-line along the first horizontal direction 1000 and a first cross-sectional dimension (e.g., as seen along the first horizontal direction 1000) of the MTJ pillar 12.

As the second etch mask may be used for patterning the first patterned SOT-layer 21 and the MTJ line 11, the twice patterned SOT-layer 22 and the MTJ pillar 12 may be formed with similar extension along the first horizontal direction 1000 and thereby be self-aligned with respect to each other.

After etching the first patterned SOT-layer 21 and the MTJ line 11, the method 100 may proceed by forming an insulating liner 41 covering sidewalls of the MTJ pillar 12 exposed on one or both sides (e.g., on either side in some instances) of the SOT-line (step 190 of FIG. 4). This may mask the MTJ pillar during processing steps and/or electrically isolate the MTJ pillar. The insulating liner 41 may protect the MTJ pillar from exposure to the ambient atmosphere that could otherwise contaminate it in some instances. The insulating liner 41 may be electrically insulating and may e.g., comprise an oxide or nitride. The insulating liner 41 may be formed as a conformal layer, e.g. using ALD, CVD or PVD.

After the method 100 as described herein, there may follow several production steps which per se are known in the art or yet to be developed, such as filling, polishing and back-end-of-line processing to interconnect the MTJ device with surrounding circuitry.

Referring again to the top-down illustration of FIG. 2a, the orthogonal orientation of the first and second mask lines of the first and second etch masks 31, 32 is shown. In FIG. 2a, elements and layers are shown at once for the sake of clarity.

In particular, the sidewall spacers 40 are for illustrative purposes transparent above the SOT-lines of the twice patterned SOT-layer 22 to offer a view of the same and of the terminals 51 below. As thus is visible in FIG. 2a, the shape of the SOT-line of the twice patterned SOT-layer 22 can be determined by the intersection of the first etch mask 31, the sidewall spacers 40 and the second etch mask 32.

The cross-sectional dimensions of the MTJ pillar 12 can be determined by the intersection of the first etch mask 31 and the second etch mask 32 in various implementations.

Figure 2B:
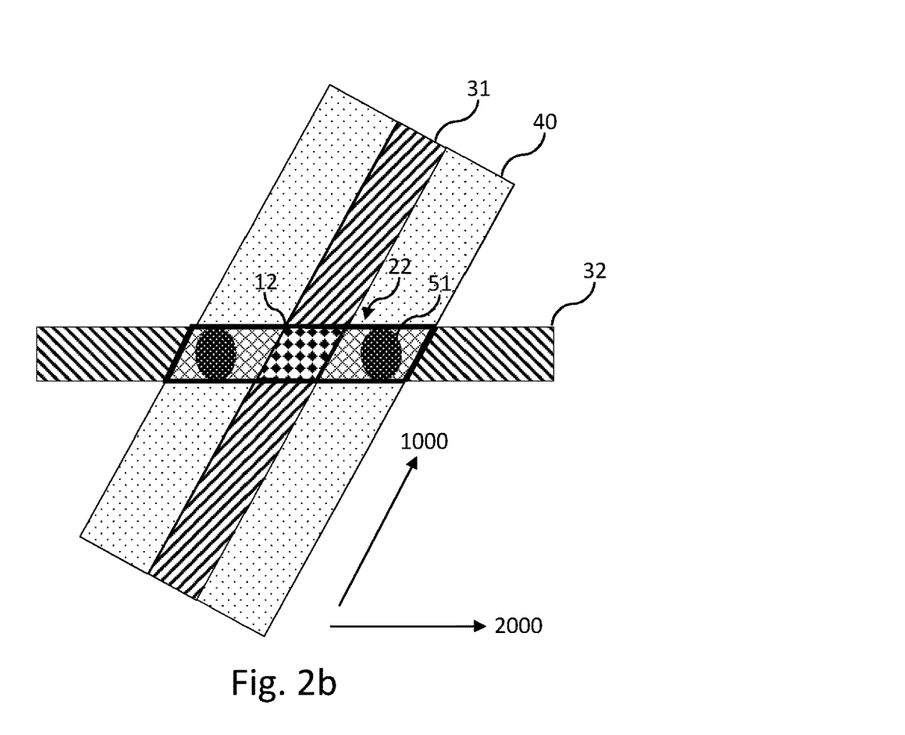
FIG. 2b is a schematic view of an example MTJ device formed using first and second mask lines oriented at non-right angles.

The top-down illustration in FIG. 2b is similar to FIG. 2a however differs in that the MTJ device is formed using first and second mask lines oriented at non-right angles with respect to each other. In particular, the first horizontal direction 1000 is changed as compared to FIG. 2a, as further clarified by the arrows.

The shape of the SOT-line of the twice patterned SOT-layer 22 can be determined by the intersection of the first etch mask 31, the sidewall spacers 40 and the second etch mask 32. The first mask line of the first etch mask 31, and the sidewall spacers 40 can extend in the first horizontal direction 1000. As the first horizontal direction 1000 can be changed compared to the configuration shown in FIG. 2a, the shape of the SOT-line of the twice patterned SOT-layer 22 can also be changed.

In a similar manner, because the cross-sectional shape of the MTJ pillar 12 can be determined by the intersection of the first etch mask 31 and the second etch mask 32, the shape of the MTJ pillar 12 can also be changed compared to FIG. 2a.

As an example, the second horizontal direction 2000 may be 30-80 degrees from the first horizontal direction 1000. In some instances, the second horizontal direction 2000 may be 45-70 or 50-60 degrees from the first horizontal direction 1000.

Different angles can allow for different shapes of the MTJ pillar 12 and the SOT-line, while allowing that they can be aligned with each other. A non-orthogonal orientation of the first and second directions 1000, 2000 can allow for introducing directional anisotropy in the SOT-line and the MTJ pillar 12 that may be used to tune SOT-switching characteristics of the MTJ device.

It should be noted that the drawings are schematic. Hence, although the drawings may indicate e.g., a rectangular cross-sectional shape of the MTJ pillar 12, in practice the MTJ pillar 12 may present rounded corners leading to a more circular cross-section of the MTJ pillar 12. In some implementations, the rhombus-like cross-section of the MTJ pillar 12 in FIG. 2b may look more like an ellipse once manufactured.

It may be difficult according to known methods to create an MTJ pillar 12 with an elliptical cross-section. As such, a non-right angle between the second horizontal direction 2000 and the first horizontal direction 1000 as in FIG. 2b can enable a way to manufacture MTJ devices with an MTJ pillar 12 with a cross-sectional shape approximating an elliptical shape.

Figure 3:
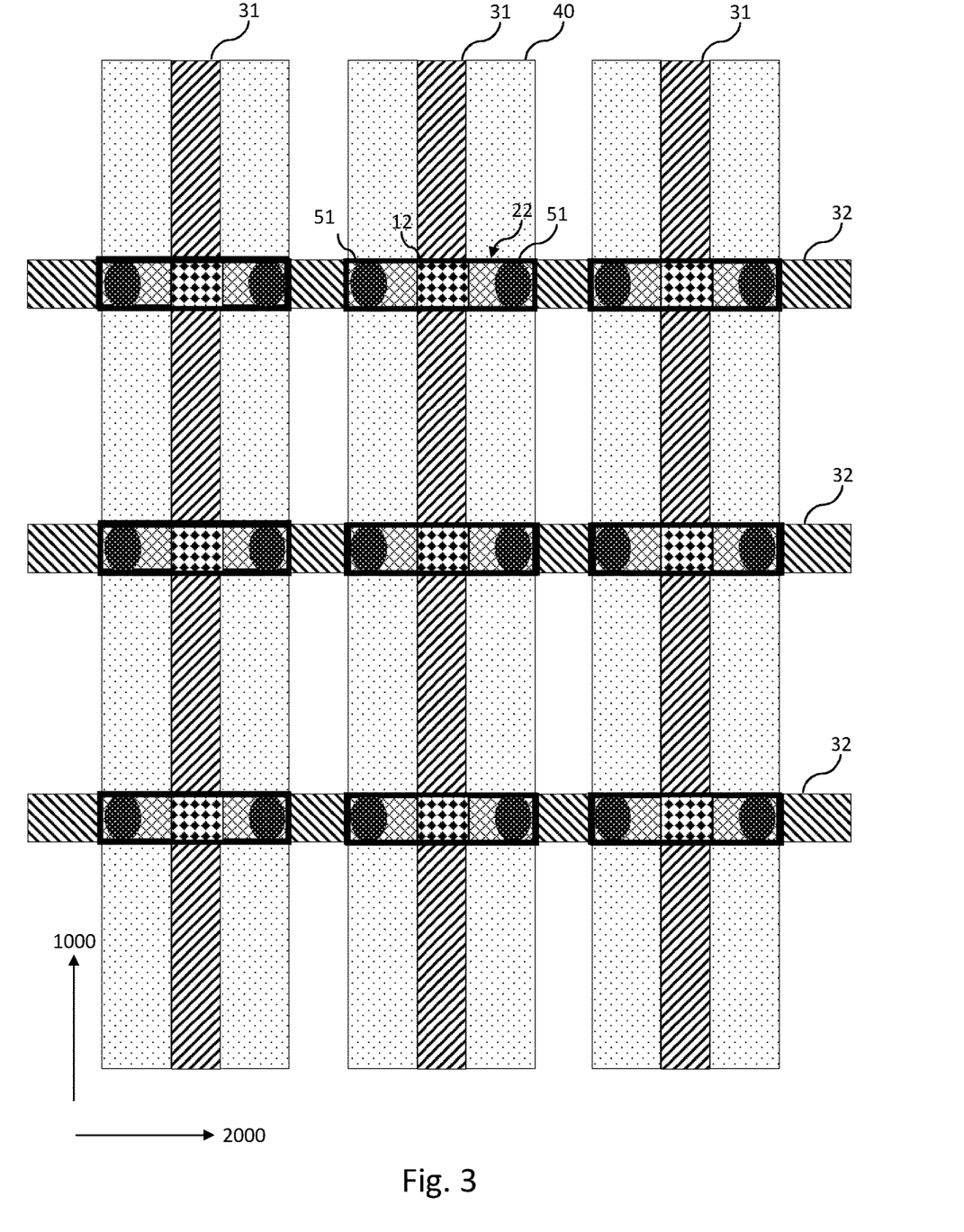
FIG. 3 is a schematic view of an example MTJ device comprising an array of MTJ pillars.

Referring now to FIG. 3, an example MTJ device comprising an array of MTJ pillars 12 is shown. This is a top-down illustration of the MTJ device after it has been formed, where elements and layers are shown at once for the sake of clarity.

The array of MTJ pillars 12 may be formed in a similar manner as the method as described thus far. This may be achieved by forming the first etch mask 31 comprising a plurality of first mask lines extending in the first horizontal direction 1000 and forming the second etch mask 32 comprising a plurality of second mask lines extending in the second horizontal direction 2000.

In various implementations, patterning the layer stack using the first etch mask 31 causes a plurality of MTJ lines extending in the first horizontal direction to be formed. The number of MTJ lines formed can correspond to the number of first etch lines formed.

Forming sidewall spacers 40 on either side of each MTJ line can allow the first patterned SOT-layer, once etched, to comprise a series of parallel SOT lines that correspond to wider versions of the plurality of first mask lines.

Patterning (e.g., using the second etch mask 32) the first patterned SOT-layer and the plurality of MTJ lines can allow forming of a twice patterned SOT-layer 22 comprising a plurality of SOT-lines extending in the second horizontal direction 2000 and an MTJ pillar 12 to be formed on each SOT-line, thereby forming the array of MTJ pillars 12.

The twice patterned SOT-layer 22 can comprise a plurality of discrete SOT-line segments extending in the second horizontal direction, e.g., each in contact with a corresponding MTJ pillar 12. The shape of each discrete SOT-line segment can be determined by the intersections between the first mask lines, the sidewall spacers 40 and the second mask lines e.g., as previously discussed in relation to FIGS. 2a-b.

The number of discrete SOT-line segments and MTJ pillars 12 can correspond to the number of intersections between the first mask lines and the second mask lines, which in the case of sufficiently long and parallel lines can equal to the number of first mask lines multiplied by the number of second mask lines.

Each discrete SOT-line segment may be addressed individually to change the magnetization state of the corresponding MTJ pillar 12. In various instances, the MTJ device comprising an array of MTJ pillars 12 as shown may be suitable to be used in a magnetoresistive random-access memory structure (MRAM structure).

The MTJ device comprising an array of MTJ pillars 12 as shown in FIG. 3 may be formed on an insulating layer embedding a plurality of terminal pairs of a first and a second terminal 51. Each terminal pair 51 can be in contact with a discrete SOT-line segment. These terminal pairs 51 may be used to individually address each discrete SOT-line segment that connects them.

The MTJ device comprising an array of MTJ pillars 12 is shown in FIG. 3 with a right angle between the first and second horizontal direction 1000, 2000. However, an MTJ device comprising an array of MTJ pillars 12 with a non-right angle between the first and second horizontal direction 1000, 2000 is also possible by adapting the teachings e.g., as previously discussed with regards to FIG. 2b.

Figure 5:
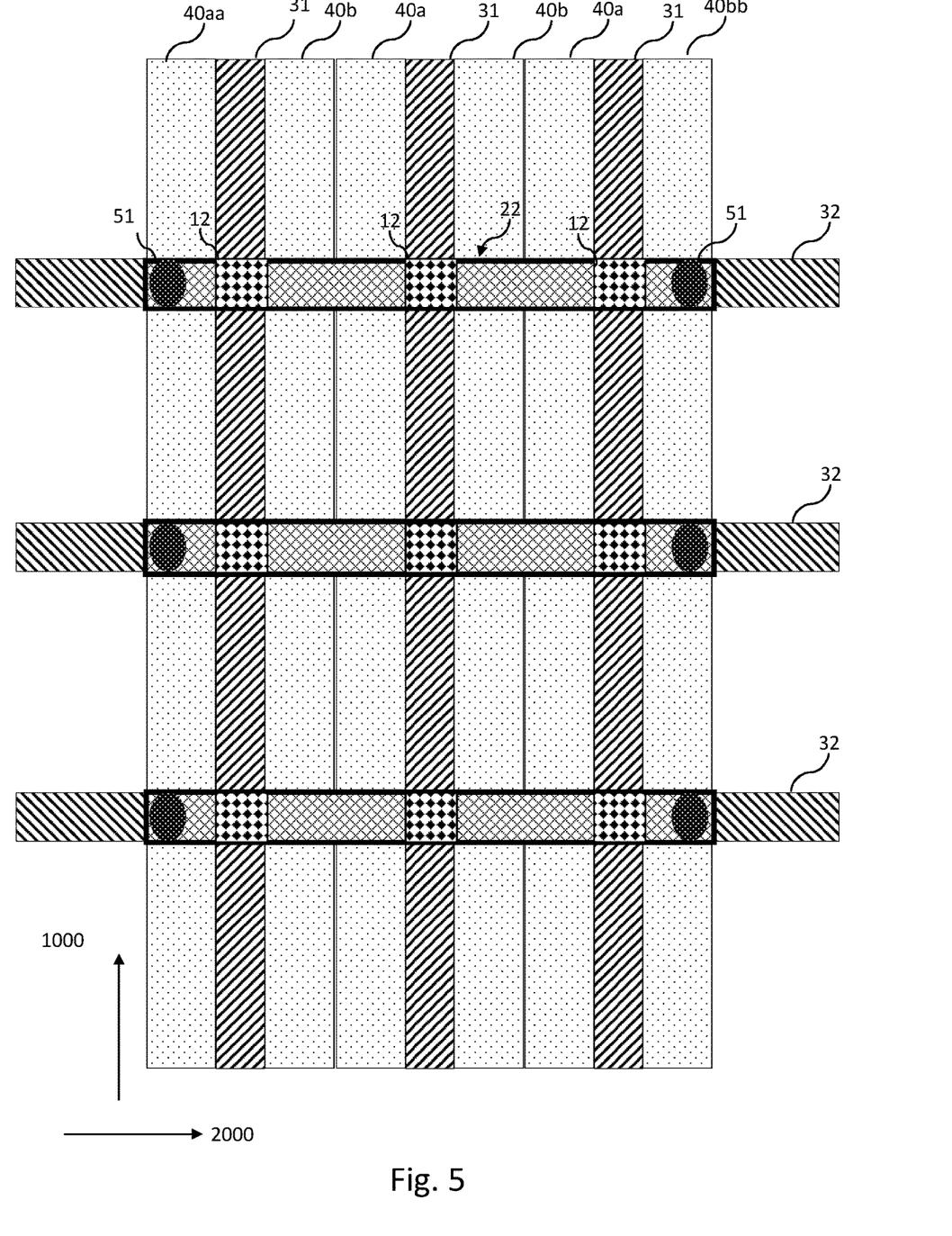
FIG. 5 is a schematic view of a further example MTJ device comprising an array of MTJ pillars.

FIG. 5 illustrates a further variation of an example MTJ device, which e.g., may be used in multi-bit cell configurations. The MTJ device is similar to that shown in FIG. 3, however differs in that more than one MTJ pillar 12 (e.g., in the illustrated example three) is formed on an SOT line 22. The method may comprise forming the sidewall spacers 40 with a (line) width (e.g., along the second horizontal direction 2000) such that a gap between a pair of consecutive MTJ lines 11 (hidden from view by mask lines 31 in FIG. 5) can be filled, e.g., "closed". In various implementations, sidewall spacers 40a, 40b on mutually facing sidewalls of neighboring MTJ lines 11 may be formed to merge. The sidewall spacers 40 may counteract etching of the SOT-layer 20 in-between neighboring MTJ lines 11 during the (first) patterning of the SOT-layer 20. Merged sidewalls spacers 40 may be obtained by forming sidewall spacers 40a, 40b with a width of at least half of a spacing between neighboring MTJ lines 11 (e.g., which can be determined by a spacing of the first mask lines 31). For example, the spacer material may be conformally deposited with a thickness of at least half of the spacing between neighboring MTJ lines 11 and be subjected to an anisotropic etch back to form the (merged) sidewall spacers 40. As further shown, the MTJ pillars 12 on a same SOT line 22 may share a pair of terminals 51. This may be achieved by forming the outermost sidewall spacers 40aa, 40bb to overlap the terminals 51.

FIG. 5 shows a single set of consecutive first mask lines 31 however the first etch mask 31 may comprise a number of such sets of regularly spaced consecutive first mask lines 31, where a spacing of first mask lines 31 within each set ("an intra-set spacing") can be less than a spacing between the sets ("an inter-set spacing"). In various implementations, a number of sets of regularly spaced consecutive MTJ lines 11 may be formed by patterning the layer stack using the first etch mask 31 as an etch mask. The sidewall spacers 40 may be formed with a width of at least half the intra-set spacing but less than the inter-set spacing. In various instances, during the first patterning of the SOT-layer 20, the merged sidewall spacers 40a, 40b may mask the SOT-layer 20 between the MTJ lines 11 of each set (intra-set), and may be etched (e.g., cut) between each set of MTJ lines 11 (inter-set).

In the above, the disclosed technology has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of forming a magnetic tunneling junction (MTJ) device, the method comprising:
    forming a layer stack comprising an MTJ layer structure and a spin-orbit torque layer (SOT-layer) below the MTJ layer structure;
    forming a first etch mask over the layer stack, the first etch mask comprising a first mask line extending in a first horizontal direction;
    patterning the layer stack to form an MTJ line extending in the first horizontal direction, wherein patterning the layer stack comprises etching while the first etch mask masks the layer stack, and stopping etching on or above the SOT-layer;
    forming sidewall spacers on one or both sides of the MTJ line;
    while the sidewall spacers mask the SOT-layer, etching the SOT-layer to form a patterned layer stack comprising the MTJ line and a first patterned SOT-layer;
    forming a second etch mask over the patterned layer stack, the second etch mask comprising a second mask line extending in a second horizontal direction across the MTJ line; and
    patterning the patterned layer stack comprising the first patterned SOT-layer and the MTJ line to form a twice patterned SOT-layer, the twice patterned SOT-layer comprising an SOT-line extending in the second horizontal direction, and to form an MTJ pillar on the SOT-line, wherein patterning the patterned layer stack comprises etching while the second etch mask masks the patterned layer stack.

2. The method according to claim 1, wherein forming sidewall spacers comprises forming sidewall spacers on both sides of the MTJ line.

3. The method according to claim 1, wherein the layer stack is formed on an insulating layer embedding a first and second terminal spaced apart in the second horizontal direction and wherein the SOT-layer is formed in contact with the first and second terminals, and
    wherein the sidewall spacers are formed to at least partially overlap the first and second terminals such that the SOT-line of the twice patterned SOT-layer connects the first and second terminals to each other.

4. The method according to claim 3, wherein the MTJ line is formed at a position between the first and second terminals.

5. The method according to claim 1, wherein the layer stack further comprises a hard mask layer, wherein after patterning the patterned layer stack, the MTJ pillar is capped by a remaining portion of the hard mask layer.

6. The method according to claim 1, wherein the second etch mask further masks the sidewall spacers, wherein after patterning the patterned layer stack, sidewall spacer portions remain at sidewalls of the MTJ pillar.

7. The method according to claim 1, wherein a fill layer is deposited to embed the layer stack before forming the second etch mask.

8. The method according to claim 1, further comprising forming an insulating liner covering sidewalls of the MTJ pillar exposed on one or both sides of the SOT-line.

9. The method according to claim 8, wherein forming an insulating liner comprises forming an insulating liner covering sidewalls of the MTJ pillar exposed on both sides of the SOT-line.

10. The method according to claim 1, wherein the second horizontal direction is 30-80 degrees from the first horizontal direction.

11. The method according to claim 1, wherein the first etch mask comprises a plurality of first mask lines extending in the first horizontal direction, and wherein the second etch mask comprises a plurality of second mask lines extending in the second horizontal direction, and wherein:
    patterning the layer stack comprises using the first etch mask to form a plurality of MTJ lines extending in the first horizontal direction;
    forming the sidewall spacers comprises forming on one or both sides of individual ones of the MTJ lines;
    etching the SOT-layer comprises, while the sidewall spacers mask the SOT-layer, etching the SOT-layer to form the patterned layer stack comprising the MTJ lines and the first patterned SOT-layer; and
    patterning the patterned layer stack to form the twice patterned layer comprises forming the twice patterned SOT-layer comprising a plurality of SOT-lines extending in the second horizontal direction, and forming a respective MTJ pillar on individual ones of the SOT-lines.

12. The method according to claim 11, wherein forming the sidewall spacers comprises forming the sidewall spacers on both sides of the individual ones of the MTJ lines.

13. The method according to claim 11, wherein the layer stack is formed on an insulating layer embedding a plurality of terminal pairs of a first and a second terminal, the first and second terminals of a respective pair being spaced apart in the second horizontal direction and wherein the SOT-layer is formed in contact with the plurality of terminal pairs, and
    wherein the sidewall spacers on a respective MTJ line are formed to at least partially overlap the first and second terminals of a respective terminal pair such that a respective SOT-line of the plurality of SOT-lines of the twice patterned SOT-layer connects a respective terminal pair to each other.

14. The method according to claim 11, wherein the layer stack further comprises a hard mask layer, wherein after patterning the patterned layer stack, each MTJ pillar is capped by a respective remaining portion of the hard mask layer.

15. The method according to claim 11, wherein the second etch mask further masks the sidewall spacers, wherein after patterning the patterned layer stack, sidewall spacer portions remain at sidewalls of each MTJ pillar.

16. The method according to claim 11, further comprising forming an insulating liner covering the sidewalls of each MTJ pillar.

17. The method according to claim 1, wherein the MTJ pillar is formed where the second etch mask overlaps the first etch mask.

18. The method according to claim 1, wherein the MTJ pillar comprises a rounded cross-section.

19. The method according to claim 1, wherein the MTJ pillar has a cross-sectional shape approximating an elliptical shape.

\* \* \* \* \*